United States Patent [19]
Kim et al.

[11] Patent Number: 5,444,026
[45] Date of Patent: Aug. 22, 1995

[54] METHOD FOR MANUFACTURING SEMICONDUCTOR DEVICE BY FORMING INSULATOR-LAYER TO SUPPRESS BUBBLE FORMATION

[75] Inventors: Chang-kyu Kim, Suwon; Myeong-beom Lee; Ji-hyun Choi, both of Seoul; Woo-in Joung, Kyungki-do; Young-jin Im, Seoul; Won-joo Kim; Jin-gi Hong, both of Kyungki-do; Geung-won Kang, Seoul, all of Rep. of Korea

[73] Assignee: Samsung Electronics Co., Ltd., Suwon, Rep. of Korea

[21] Appl. No.: 74,761

[22] Filed: Jun. 10, 1993

[30] Foreign Application Priority Data

Jun. 10, 1992 [KR] Rep. of Korea .................. 92-10069

[51] Int. Cl.$^6$ ............................................. H01L 21/316
[52] U.S. Cl. .................................. 437/240; 437/978; 437/241
[58] Field of Search ............... 437/238, 241, 978, 240; 148/DIG. 43

[56] References Cited

U.S. PATENT DOCUMENTS

| | | | |
|---|---|---|---|
| 4,732,761 | 3/1988 | Machida et al. | 437/238 |
| 4,879,253 | 11/1989 | Wakamatsu | 437/41 |
| 4,997,790 | 3/1991 | Woo et al. | 437/978 |
| 5,094,984 | 3/1992 | Liu et al. | 437/DIG. 43 |
| 5,117,273 | 5/1992 | Stark et al. | 437/978 |
| 5,164,881 | 11/1992 | Ahn . | |
| 5,200,358 | 4/1993 | Bollinger et al. | 437/978 |
| 5,231,046 | 7/1993 | Tasaka | 437/240 |
| 5,268,333 | 12/1993 | Lee et al. | 437/240 |
| 5,275,972 | 1/1994 | Ogawa et al. | 437/978 |

OTHER PUBLICATIONS

Wolf et al, *Silicon Processing for the VLSI Era vol. 1—Process Technology*, pp. 18–34, 193–194, Copyright ©1986 by Lattice Press.

*Primary Examiner*—Olik Chaudhuri
*Assistant Examiner*—S. Mulpuri
*Attorney, Agent, or Firm*—Charles R. Donohoe; Robert A. Westerlund, Jr.; Stephen R. Whitt

[57] ABSTRACT

The present invention forms a intermediate layer between a conductive layer and BPSG layer. In one embodiment, this intermediate layer is a buffer layer that absorbs excess P ions from the BPSG layer to suppress the formation of bubbles and thereby prevent short circuits that may be caused due to the presence of bubbles in the BPSG layer. In the second embodiment the intermediate layer is a thin nitride layer, which prevents the conductive layer and BPSG layer from being in direct contact with each other to suppress the formation of bubbles and also prevent short circuits that may be caused due to the presence of bubbles in the BPSG layer.

7 Claims, 4 Drawing Sheets

METHOD FOR MANUFACTURING SEMICONDUCTOR DEVICE BY FORMING INSULATOR-LAYER TO SUPPRESS BUBBLE FORMATION

BACKGROUND OF THE INVENTION

The present invention relates to a method for manufacturing a semiconductor device, and particularly to a method for manufacturing a semiconductor device which, during the formation of an interlevel dielectric layer, removes the defects created between the interface of the interlevel dielectric layer and a conducting layer to enhance reliability.

To improve performance of semiconductor devices, fineness and high packing density are essential. High packing density can be accomplished by reducing the device size itself. For example, devices previously formed on one layer are instead separately constructed on multiple layers in a multilevel metallization structure. In such a multilevel metallization structure, in order to form a second wire-layer pattern on a first wire-layer pattern, an interlevel dielectric layer is thus formed between the wire layers. Planarization becomes a crucial requirement.

To form a conductive layer and an interlevel dielectric layer for metallization, it is known to first form a conductive material layer on a substrate, which is then patterned by a photo-etching step to form the conductive layer. The interlevel dielectric layer is then formed on the conductive layer and a planarization step is carried out. Planarization of the interlevel dielectric layer is generally classified as an inter-metal dielectric (IMD) process and an inter-layer dielectric (ILD) process.

The IMD process is a composite process using, for example, a spin-on-glass (SOG) layer. When a conductive layer is formed of aluminum having a low melting point, as in the SOG composite process, the planarization is performed by in-situ deposition and an etching step. However, since the composite process using the SOG layer employs many steps, the process is known to have a high probability of producing a crack in the SOG layer of the formed device.

The ILD process is a widely used process in which, for instance, BPSG is deposited and thermally treated at a temperature over 850° C. to planarize the interlevel dielectric. R. A. Levy and K. Nassau disclose such a process in Solid State Technol., pp 123–129 (October, 1986), reporting that the viscous behavior of phosphosilicate-glass (PSG) and BPSG in VLSI processing reduces thermal damage to the devices.

However, the ILD process described above, using BPSG becomes difficult, as devices become minute, because low temperature flowing (lowering of the treating temperature of the BPSG) required for such minute device deteriorates the evenness of the interlevel dielectric layer. Thus, forming a low-resistant conductive layer and an interlevel dielectric layer having excellent evenness characteristic is difficult using known processing methods. This is particularly true if tungsten is used in the conductive structure (such as, for a bit line in memory) because the tungsten becomes oxidized in succeeding heat treatment.

Recently, a modified planarization process using the low-temperature flow of BPSG has also been widely employed. To decrease the flow temperature of the BPSG, the flow atmosphere can be modified or the concentration of boron (B) or phosphorus (P) in the BPSG can be increased. Of these, the method using a BPSG layer containing B or P in high concentration is preferred.

However, when the concentration of B is increased over a specific level (about 4 wt %), boric acid crystal is created and causes cracking. Thus, increasing the concentration of B has an upper limit. When the interlevel dielectric layer is formed using BPSG containing P of high-concentration, an excessive amount of P ions move toward the conductive layer in which polycrystalline silicon is present during flowing. This produces bubbles on the interface between the conductive layer and the interlevel dielectric layer. Later heat treatment increases the size of the bubbles. The thicker the P concentration is, the more serious this problem becomes.

Studies on the bubbles formed due to the use of BPSG containing P of high concentration are disclosed by D. S. Williams and E. A. Dein, J. Electrochem. Soc., vol. 134, pp 657–664(1987) and by Hideki Takeuchi and Junichi Muroto, ibid, vol. 131, pp 403–472(1984). The formed bubbles may be opened during a succeeding step of forming a contact opening, to then possibly causing a short between conductive layers and deteriorating the reliability of the semiconductor device.

FIGS. 1A–1C sequentially show a planarization process of a conventional method using BPSG of high concentration.

Referring to FIG. 1A, a first interlevel dielectric layer 2, for instance, a BPSG layer, is formed on a semiconductor substrate 1. A polycrystalline silicon layer 3 doped with an impurity and a conductive material layer 4 (made of Wsi) are formed thereon. The conductive material layer is patterned by a photo-etching step into a predetermined pattern to form a conductive layer 12, for instance, a bit line. When conductive layer 12 is made of polycrystalline silicon or tungsten-silicide having a relatively high melting point, planarization is performed by the deposition and flow of the BPSG layer.

Subsequently, BPSG layer 6, containing a high concentration of P, is formed on the overall surface of conductive layer 12 as a second interlevel dielectric layer and is thermally treated to planarize the resultant structure.

In order to overcome the poor step coverage due to high packing density, as shown in FIG. 1B, another BPSG layer is formed on BPSG layer 6 as a third interlevel dielectric layer 7. The planarization layer is formed with two layers because, when the planarization layer is formed with a single layer, the surface unevenness of the lower structure cannot be controlled to the required degree. Thus, the planarization layer is formed with usually two, and sometimes three, layers to obtain an even planar surface.

Then, as shown in FIG. 1C, a contact opening 8 is formed in a predetermined portion.

When the BPSG of high concentration is deposited on conductive layer 12 and is thermally treated in the conventional method as described above (FIG. 1A), an excessive amount of phosphorus (P) ions in the BPSG produces bubbles 10 between the surfaces of the BPSG layer and conductive layer 12. The bubbles 10 increase in size during the succeeding heat treatment, as shown in FIG. 1B.

If the bubbles are formed, during the forming of the contact opening, the bubbles can then be opened (as in FIG. 1C) to cause shorts between conductive layers. This decreases the reliability of the device.

SUMMARY OF THE INVENTION

Therefore, it is an object of the present invention to provide a method of manufacturing an interlevel dielectric layer over a conductor which prevents defects from occurring while using BPSG of high concentration P.

Particularly when the conductive layer is one of a polysilicon layer, a tungsten-silicide layer, and a polycide layer containing polysilicon and tungsten-silicide layer, the P bubbles formation becomes severe when using conventional methods. If these same conductive layers are used along with the present invention, bubbles are not so formed. The device formed therefrom is thus highly reliable.

BRIEF DESCRIPTION OF THE DRAWINGS

The above object and advantages of the present invention will become more apparent by describing in detail preferred embodiments thereof with reference to the attached drawings in which.

DETAILED DESCRIPTION OF THE INVENTION

A method for removing bubbles produced on the interface between a conductive layer and an interlevel dielectric layer by forming a buffer layer on the top of the conductive layer will be described below as a first embodiment of the present invention with reference to FIGS. 2A, 2B and 2C.

Figure 1A:
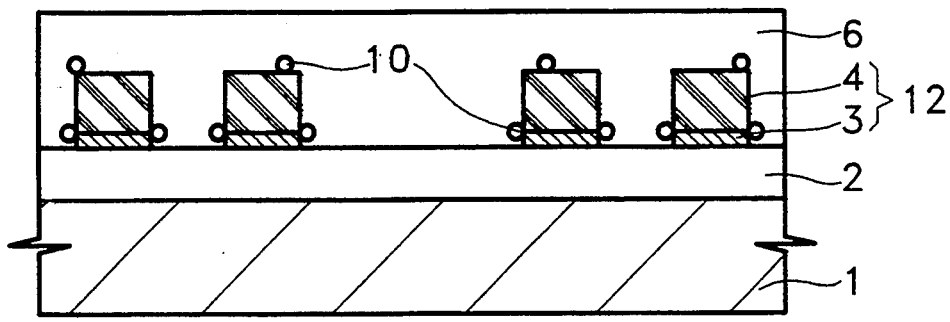
FIGS. 1A, 1B and 1C sequentially show a planarization process which uses high concentration BPSG, according to a conventional method.
Figure 1B:
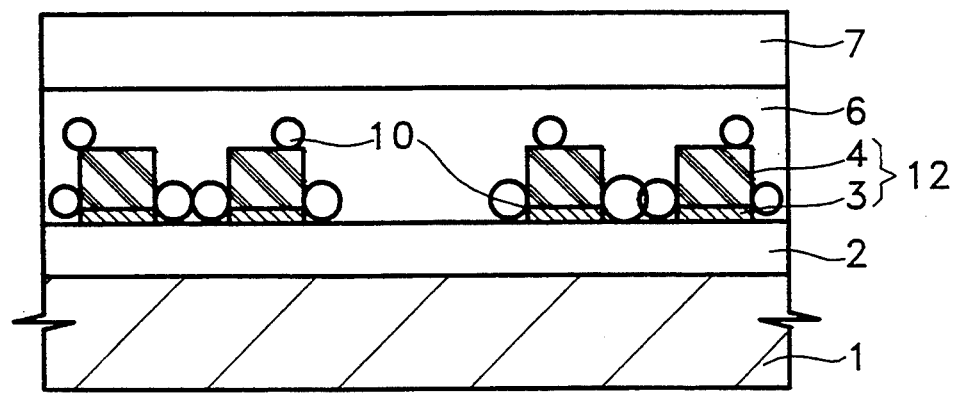
Figure 1C:
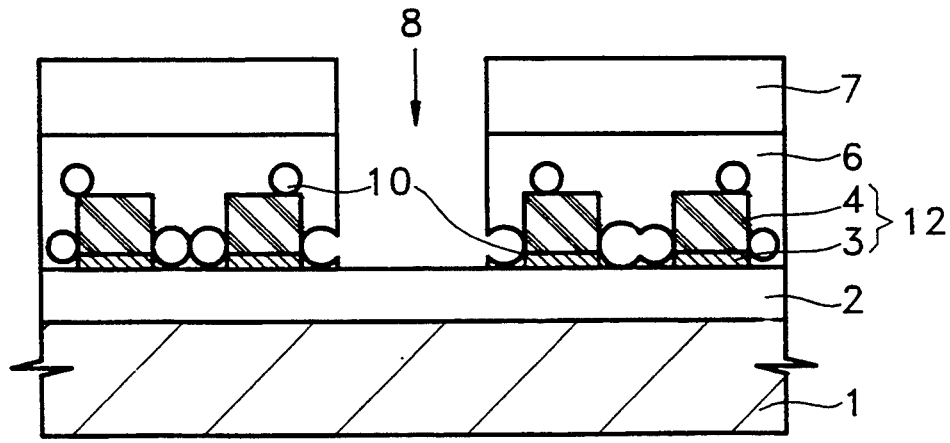
Figure 2A:
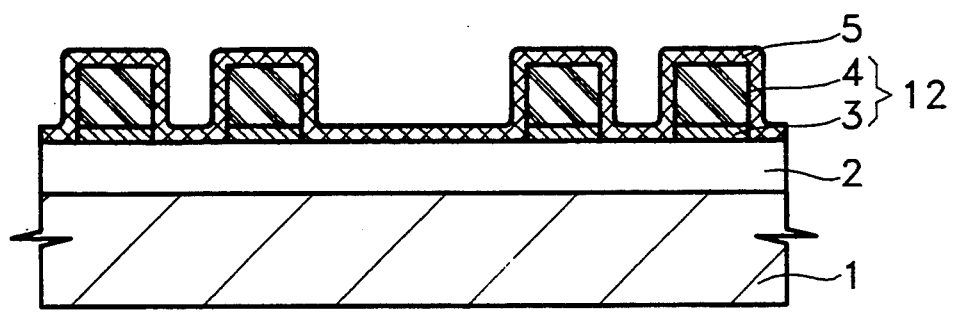
FIGS. 2A, 2B and 2C sequentially show a planarization process of a first embodiment of the present invention.

Referring to FIG. 2A, a first interlevel dielectric layer is formed on the semiconductor substrate, and a conductive layer is formed on the dielectric layer. A buffer layer serving as the intermediate layer is formed on the resultant structure. Specifically, a BPSG layer 2 is formed on semiconductor substrate 1 as the first interlevel dielectric layer. Then, a polysilicon layer 3 doped with an impurity and a tungsten-silicide layer 4 are sequentially deposited and patterned on the resultant structure, so as to form a conductor, such as a bit line 12. Subsequently, a plasma-enhanced oxide layer 5 is formed as the buffer layer to a thickness of 400 Å–700 Å on the overall surface of the resultant structure. Here, it is undesirable that the layer be thinner than 400 Å because then its effect as an intermediate layer is less significant. It is also undesirable that the layer be thicker than 700 Å because the probability of creating defects in which craters are produced on the sides of a successively formed contact opening is increased. It is most desirable that the layer is formed to a thickness of 500 Å.

Figure 2B:
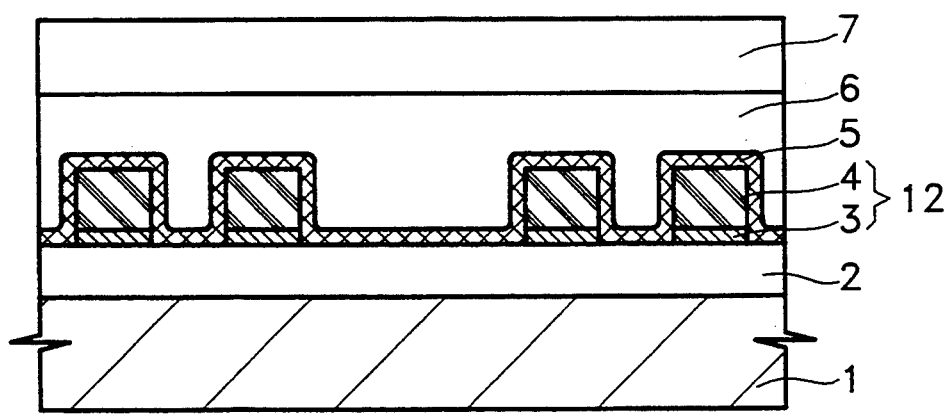

FIG. 2B illustrates forming second and third interlevel dielectric layers on the buffer layer serving as the intermediate layer. Specifically, BPSG is deposited on plasma-enhanced oxide layer formed by silane 5 and is thermally treated for about 30 minutes at 800° C.–900° C., preferably at 850° C., to form BPSG 6 as the second interlevel dielectric. BPSG is deposited again on BPSG 6 and thermally treated to form BPSG 7 as the third interlevel dielectric layer. When the plasma-enhanced oxide layer is formed as the buffer layer and repeatedly heat-treated, the plasma-enhanced oxide layer formed by silane 5 bears the properties of BPSG so that the wet etch rate of the oxide layer is almost the same as that of the BPSG layer used as the third interlevel dielectric 7. This is because the repeated heat treatments cause an excessive amount of P ions in the BPSG to be interdiffused by the buffer layer.

Figure 2C:
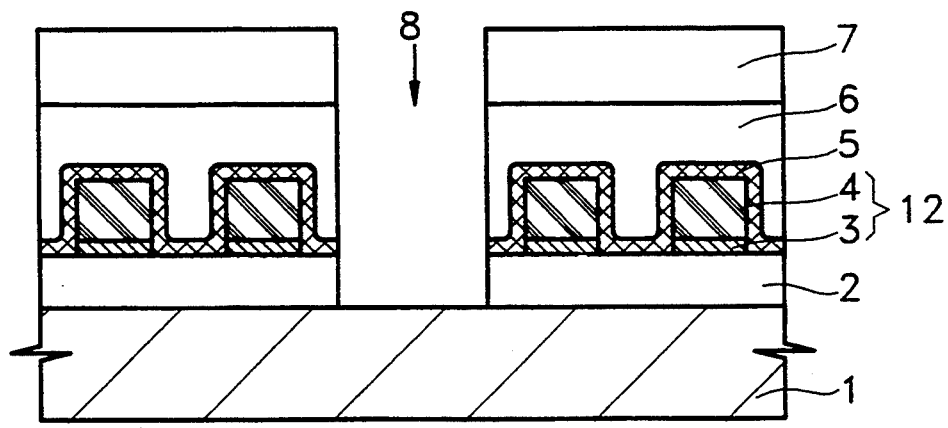

In FIG. 2C, the interlevel dielectrics are all etched in a predetermined portion to form a contact opening. When predetermined portions of third interlevel dielectric layer 7, second interlevel dielectric layer 6, buffer layer 5 and first interlevel dielectric layer 2 are sequentially etched to form contact opening 8, a clean profile is obtained, as shown in FIG. 2C, without the defects of crater-shaped openings created on the inner sides of the contact due to the different etching rates of the interlevel dielectric layers. Also, since buffer layer 5 is formed between conductor 12 and the high concentration BPSG layer 6, bubbles can be prevented on the interface between bit line 12 and BPSG layer 6.

The second embodiment of the present invention will be described below with reference to FIGS. 3A, 3B and 3C. In this embodiment, bubbles are preventing while still using high concentration BPSG by plasma-surface-treating the top of the conductive layer to form a nitride layer on the conductive layer.

Figure 3A:
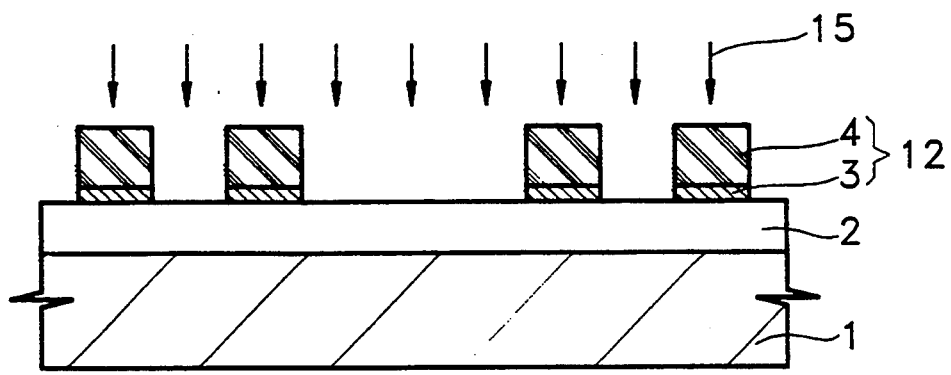
FIGS. 3A, 3B and 3C sequentially show a planarization process of a second embodiment of the present invention.

FIG. 3A illustrates a process of forming the first interlevel dielectric layer and conductive layer on the semiconductor substrate according to the conventional method, and then plasma-surface-treating the top of the conductive layer. First, the BPSG layer is formed on semiconductor substrate 1 as the first interlevel dielectric layer 2, followed by polysilicon 3 doped with an impurity and the tungsten-silicide 4 being sequentially deposited thereon to thicknesses of 500 Å and 1,500 Å, respectively, and patterned to form conductive layer 12. Subsequently, $N_2 + NH_3$ plasma treatment 15 is performed onto the surface of conductive layer 12. Here, the conditions of the $N_2 + NH_3$ plasma treatment are that the processing time is 450–600 seconds (preferably 500), the pressure is 2–3 torr (preferably 2.5), the RF power is 350–400 W (preferably 400), the temperature is 350°–450° C. (preferably 400), the spacing is 300–400 mils (preferably 350), the $NH_3$ flowing rate is 700–800 CCM (preferably 750), and the $N_2$ flow rate is 2,000–2,300 CCM (preferably 2,200).

Through the above-mentioned plasma treatment, silicon nitride (such as SiN, $Si_3N_4$, a mixture thereof, etc.) is obtained through the reaction of the activated nitrogen ions in plasma with a large amount of silicon in the conductive layer. This kind of reaction may occur between plasma ions and other conductive materials rather than between the above nitrogen ions and silicon.

Figure 3B:
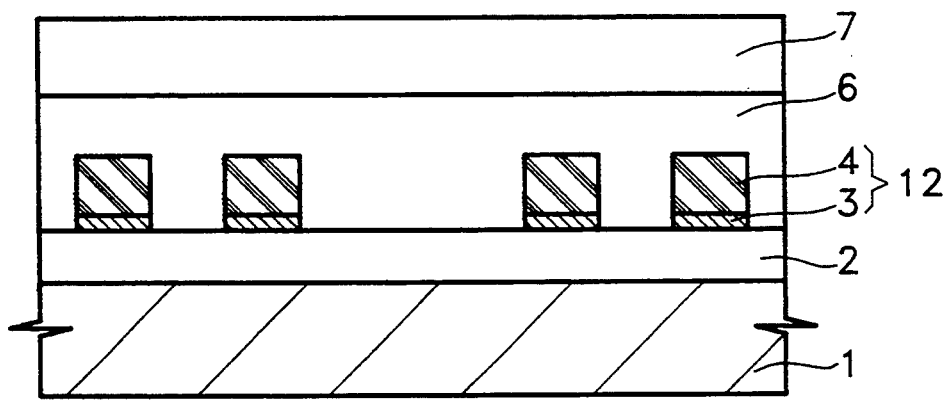

FIG. 3B shows a structure in which the second and third interlevel dielectric layers are formed on the surface-treated conductive layer. Specifically, BPSG is deposited on the overall surface of the resultant structure, which has been obtained after the surface treatment of conductive layer 12, and flows at about 850° C. to form BPSG 6, serving as the second interlevel dielectric layer. BPSG is deposited and heat treated again to form BPSG 7, serving as the third interlevel dielectric layer.

Figure 3C:
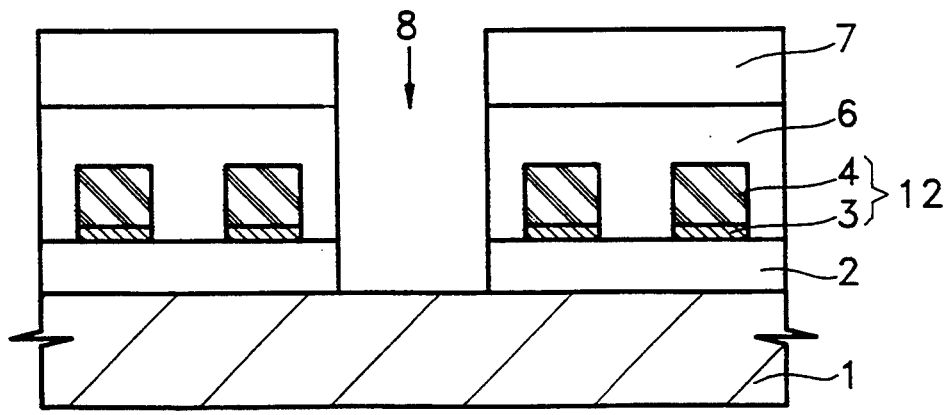

FIG. 3C shows the resultant structure in which the interlevel dielectric layers are sequentially etched to form a contact opening in an intended portion. Specifically, a predetermined portion of the third interlevel dielectric layer 7, second interlevel dielectric layer 6 and first interlevel dielectric layer 2 are sequentially etched to form contact opening 8 with a clean profile (without defects on the inner walls of the contact hole) as shown in FIG. 3C.

When the surface of the conductive layer is treated according to the second embodiment of the present invention, if a plasma treatment using $N_2O$ or $N_2$ is carried out instead of the $N_2+NH_3$ plasma treatment, the same results preventing the forming of BPSG bubbles, can be accomplished.

Figure 4A:
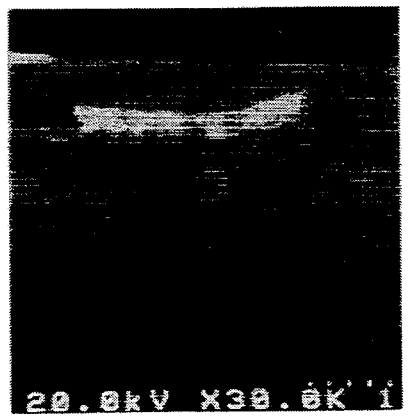
FIGS. 4A and 4B are SEM micrographs using a magnification factor of 30,000 to show a wiring layer manufactured according to a planarization process of the conventional method and of the present invention, respectively.
Figure 4B:
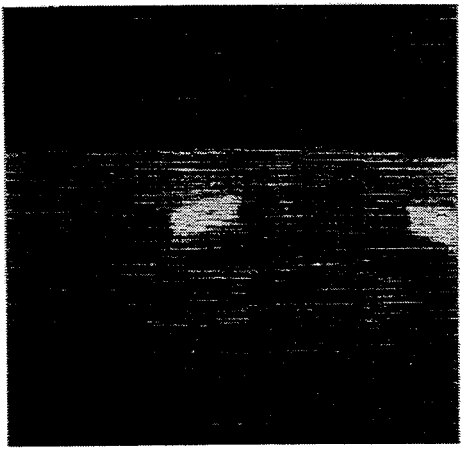

FIGS. 4A and 4B are SEM micrographs at a magnification factor of 30,000 and obtained by applying 20.0 kV. Here, the presence or absence of BPSG bubbles is shown for a semiconductor device formed according to the conventional method (FIG. 4A) and the second embodiment of the present invention (FIG. 4B) in which the plasma surface treatment is performed. The micrograph according to the conventional method shows the state of bubble creation in which BPSG is deposited on the same conductive layer as that of the second embodiment of the present invention, flows under the atmosphere of $N_2$ for 30 minutes at 850° C., and the succeeding heat treatment is carried out three times at 900° C. for 30 minutes under the atmosphere of $N_2$.

According to the micrographs, when a semiconductor device is manufactured by the conventional method, as shown in FIG. 4A, it can be seen that bubbles are formed. When a semiconductor device is manufactured by the second embodiment of the present invention, as shown in FIG. 4B, it can be seen that such bubbles are not created.

As described above, in the present invention, during the forming of a high concentration BPSG layer for a low-temperature planarization process, a buffer layer is formed between a conductive layer and BPSG layer or the conductive layer is surface-treated so that the defects such as the creation of bubbles on the surface of the conductive layer and BPSG layer due to the high concentration BPSG are removed to enhance the reliability of a semiconductor device.

While the invention has been described in connection with what is presently considered to be the most practical and preferable embodiments, it is to be understood that the invention is certainly not limited to these disclosed embodiments, but, on the contrary, is intended to cover various modifications and equivalent arrangements included within the spirit and scope of the appended claims.

What is claimed:

1. A method for manufacturing a portion of a semiconductor device comprising the steps of:
    forming a conductive layer on a semiconductor substrate;
    forming an intermediate layer of plasma-enhanced oxide having thickness of substantially 400 $A^0$–700 $A^0$ to entirely cover the conductive layer; and
    forming a BPSG layer on said intermediate layer, so that during formation of said BPSG layer, bubbles are substantially eliminated due to the presence of said intermediate layer.

2. A method according to claim 1, wherein said conductive layer is selected from the group consisting of polysilicon layer, a tungsten silicide layer, and a polycide layer containing polysilicon and tungsten silicide.

3. A method according to claim 1, wherein said step of forming said BPSG layer comprises the steps of deposited said BPSG layer, causing said BPSG layer to flow, and subsequently heat treating said flowed BPSG layer.

4. A method according to claim 1 further comprising the step of heat treating said BPSG layer so that said intermediate layer has a wet etch rate substantially equal to that of said BPSG layer.

5. A method according to claim 1 further including a step of forming metal lines through patterning after said step of forming a conductive layer.

6. A method for manufacturing a semiconductor device comprising the steps of:
    forming a conductive layer on a semiconductor substrate;
    forming a plasma-enhanced oxide layer having thickness of substantially 400 $A^0$–700 $A^0$ to entirely cover said conductive layer; and
    forming a first BPSG layer on the oxide layer so that during formation of said BPSG layer bubbles are substantially eliminated due to the presence of said plasma-enhanced oxide layer; and
    forming a second BPSG layer on said first BPSG layer to further planarize a top surface of said second BPSG layer.

7. A method for manufacturing a semiconductor device comprising the steps of:
    forming a conductive layer on a semiconductor substrate;
    forming a nitride layer to entirely cover said conductive layer by surface-treating said conductive layer with at least one of $N_2$ plasma, $N_2+NH_3$ plasma and $N_2O$ plasma; and
    forming a first BPSG layer on said nitride layer so that during formation of said BPSG layer bubbles are substantially eliminated due to the presence of said nitride layer; and
    forming a second BPSG layer on said first BPSG layer to further planarize a top surface of said second BPSG layer.

* * * * *